(12) United States Patent
Furukawa (10) Patent No.: US 8,795,432 B2
(45) Date of Patent: Aug. 5, 2014

(54) APPARATUS FOR PULLING SILICON SINGLE CRYSTAL

(75) Inventor: Jun Furukawa, Tokyo (JP)

(73) Assignee: Sumco Corporation, Tokyo (JP)

(*) Notice: Subject to any disclaimer, the term of this patent is extended or adjusted under 35 U.S.C. 154(b) by 811 days.

(21) Appl. No.: 12/090,031

(22) PCT Filed: May 30, 2007

(86) PCT No.: PCT/JP2007/060995
§ 371 (c)(1),
(2), (4) Date: Apr. 11, 2008

(87) PCT Pub. No.: WO2008/146371
PCT Pub. Date: Dec. 4, 2008

(65) Prior Publication Data
US 2010/0170432 A1    Jul. 8, 2010

(51) Int. Cl.
*C30B 15/30* (2006.01)
*C30B 29/06* (2006.01)
*C30B 30/04* (2006.01)

(52) U.S. Cl.
CPC .............. *C30B 29/06* (2013.01); *C30B 15/30* (2013.01); *C30B 30/04* (2013.01)
USPC ............................ 117/208; 117/200; 117/206

(58) Field of Classification Search
CPC ........ C30B 15/00; C30B 15/20; C30B 15/22; C30B 15/30; C30B 15/305
USPC .......................... 117/206, 208, 200, 931–932
See application file for complete search history.

(56) References Cited

U.S. PATENT DOCUMENTS

| | | | |
|---|---|---|---|
| 4,565,671 A * | 1/1986 | Matsutani et al. ............ | 117/217 |
| 4,592,895 A | 6/1986 | Matsutani et al. | |
| 4,847,052 A | 7/1989 | Takasu et al. | |
| 5,306,387 A | 4/1994 | Fusegawa et al. | |
| 5,725,661 A | 3/1998 | Fusegawa et al. | |
| 5,766,346 A | 6/1998 | Hayashi et al. | |
| 5,792,255 A | 8/1998 | Iino et al. | |
| 5,851,283 A * | 12/1998 | Hoshi et al. ...................... | 117/32 |

(Continued)

FOREIGN PATENT DOCUMENTS

| EP | 0 466 457 | 1/1992 |
|---|---|---|
| EP | 0 829 561 | 8/1998 |

(Continued)

OTHER PUBLICATIONS

Jin et al, WO2005/0041474.*

(Continued)

*Primary Examiner* — Michael Kornakov
*Assistant Examiner* — Kenneth A Bratland, Jr.
(74) *Attorney, Agent, or Firm* — Greenblum & Bernstein, P.L.C.

(57) ABSTRACT

An apparatus for pulling a silicon single crystal, comprising: a crucible that stores a silicon melt; a heater that heats the crucible; a crucible driving unit for rotating and/or lifting up and down the crucible; a chamber that holds the crucible and the heater; and a magnetic field applying unit that is provided outside the chamber and applies a magnetic field to the chamber, wherein the magnetic field applying unit is formed along the outer peripheral surface of the chamber such that substantially concentric circle-shaped equi-strength lines of the magnetic field are formed about a center axis of the crucible.

2 Claims, 10 Drawing Sheets

(56) References Cited

U.S. PATENT DOCUMENTS

| | | | |
|---|---|---|---|
| 5,882,398 | A | 3/1999 | Sonokawa et al. |
| 5,968,266 | A | 10/1999 | Iino et al. |
| 6,077,343 | A | 6/2000 | Iida et al. |
| 6,156,119 | A | 12/2000 | Hoshi et al. |
| 6,190,452 | B1 | 2/2001 | Sakurada et al. |
| 6,458,204 | B1 | 10/2002 | Okui et al. |
| 6,592,662 | B2 | 7/2003 | Fusegawa et al. |
| 6,632,280 | B2 | 10/2003 | Hoshi et al. |
| 6,893,499 | B2 | 5/2005 | Fusegawa et al. |
| 6,913,646 | B2 | 7/2005 | Sakurada et al. |
| 6,984,264 | B2 * | 1/2006 | Shimonosono et al. ........ 117/30 |
| 2008/0060572 | A1 | 3/2008 | Fu et al. |

FOREIGN PATENT DOCUMENTS

| | | |
|---|---|---|
| EP | 1 076 120 | 2/2001 |
| EP | 1801268 | 6/2007 |
| JP | 60-027682 | 2/1985 |
| JP | 62-256788 | 11/1987 |
| JP | 05-155682 | 6/1993 |
| JP | 06-092776 | 4/1994 |
| JP | 2556967 | 9/1996 |
| JP | 2546736 | 10/1996 |
| JP | 08-333191 | 12/1996 |
| JP | 09-020595 | 1/1997 |
| JP | 09-183691 | 7/1997 |
| JP | 09-188590 | 7/1997 |
| JP | 09-208364 | 8/1997 |
| JP | 2694310 | 9/1997 |
| JP | 09-263491 | 10/1997 |
| JP | 2767074 | 4/1998 |
| JP | 10-120485 | 5/1998 |
| JP | 2807594 | 7/1998 |
| JP | 10-279394 | 10/1998 |
| JP | 10-279399 | 10/1998 |
| JP | 2849537 | 11/1998 |
| JP | 11-255578 | 9/1999 |
| JP | 11-255579 | 9/1999 |
| JP | 11-268987 | 10/1999 |
| JP | 2000-001391 | 1/2000 |
| JP | 2000-053497 | 2/2000 |
| JP | 2000-119095 | 4/2000 |
| JP | 2000-178099 | 6/2000 |
| JP | 2000-247787 | 9/2000 |
| JP | 2001-158690 | 6/2001 |
| JP | 2001-348292 | 12/2001 |
| JP | 2002-068887 | 3/2002 |
| JP | 2002-137988 | 5/2002 |
| JP | 2002-201093 | 7/2002 |
| JP | 2003-002780 | 1/2003 |
| JP | 3443822 | 6/2003 |
| JP | 2004-051475 | 2/2004 |
| JP | 2004-189559 | 7/2004 |
| JP | 2004189559 A * | 7/2004 |
| JP | 2004-315289 | 11/2004 |
| JP | 2007-210865 | 8/2007 |
| WO | 00/52235 | 9/2000 |
| WO | 01/57293 | 8/2001 |
| WO | 01/63027 | 8/2001 |
| WO | 02/02852 | 1/2002 |
| WO | 02/10485 | 2/2002 |
| WO | WO 2005004174 A1 * | 1/2005 |
| WO | 2006/025238 | 3/2006 |

OTHER PUBLICATIONS

H. Hanssum publication entitled "The mangetic field of saddle-shaped coils: I. symmetry of the magnetic field around the coil centre," J. Phys. D: Appl. Phys., vol. 17, pp. 1-18 (1984).*
Extended European Search Report dated Apr. 8, 2010 that issued with respect to patent family member European Patent Application No. 07744408.1.
English language Abstract of JP 2000-247787.
English language Abstract of JP 2004-051475.
English language Abstract of JP 09-188590.
English language Abstract of JP 2000-119095.
English language Abstract of JP 2004-315289.
English language Abstract of JP 60-027682.
English language Abstract of JP 62-256788.
English language Abstract of JP62-256791.
English language Abstract of JP 09-263493.
English language Abstract of JP 07-089791.
English language Abstract of JP 2002-137988.
English language Abstract of JP 10-279399.
English language Abstract of JP11-255578.
English language Abstract of JP 11-255579.
English language Abstract of JP09-208364.
English language Abstract of JP09-020595.
English language Abstract of JP 08-333191.
English language Abstract of JP 11-268987.
English language Abstract of JP 09-183691.
English language Abstract of JP 2000-178099.
English language Abstract of JP 04-074789.
English language Abstract of JP09-263491.
English language Abstract of JP 2000-053497.
English language Abstract of JP 2003-002780.
English language Abstract of JP 2001-348292.
English language Abstract of JP 2000-001391.
English language Abstract of JP2002-201093.
English language Abstract of JP 2002-068887.
English language Abstract of JP 04-055388.
English language Abstract of JP 05-155682.
English language Abstract of JP 05-270973.
English language Abstract of JP 06-092776.
English language Abstract of JP 05-097568.
English language Abstract of JP 2001-158690.
U.S. Appl. No. 11/996,642, filed Jan. 24, 2008.
Japan Office action, dated Oct. 30, 2012 along with an english translation thereof, for Appl. No. 2009-516108.
E.P.O. Office action, mail date is Sep. 5, 2013, for EP 07 744 408.1.
"The Magnetic field of saddle-shaped coils : I.Symmetry of the magnetic field around the coil centre", H. Hanssum, Journal of Physics D: Applied Physics, vol. 17, pp. 1-18 (1984), XP020012736.

* cited by examiner

APPARATUS FOR PULLING SILICON SINGLE CRYSTAL

TECHNICAL FIELD

The present invention relates to an apparatus for pulling a silicon single crystal and to a method of pulling a silicon single crystal, which are used to grow silicon single crystals by the Czochralski method.

BACKGROUND ART

In a manufacturing process of silicon single crystals, polycrystalline silicon raw materials charged in a crucible are heated by a heater to form a silicon melt, and silicon single crystals are grown by pulling the crystals from the silicon melt in accordance with the Czochralski (CZ) method. Silicon wafers are manufactured by slicing (cutting) the silicon single crystal which has been manufactured by the above-described method, and devices such as integrated circuits or the like are formed on the silicon wafer.

There is a trend for increasing the diameter of the silicon single crystal so as to form large numbers of circuits on a single silicon wafer. On the other hand, the increasing diameter of the silicon single crystal cause problems in a single crystal growth technique, for example, reducing oxygen concentration in the single crystal, stabilizing qualities, and improvement of production yield. As a solution for such problems, there is a method to realize reduction of oxygen concentration in the single crystal and stabilizing the crystal growth by the application of a HMCZ (Horizontal magnetic field applied CZ) technique in which a horizontal magnetic field is applied during the CZ crystal growth.

In another known method, a solid-liquid interface constituting the boundary between the silicon single crystal is controlled to have a upwardly convex shape protruding towards the single crystal side, thereby increasing axial thermal gradient in the single crystal in the vicinity of the solid-liquid interface, and obtaining the effect of in-plane homogeneity (Japanese Unexamined Patent Application, First Publication, No. 2001-158690).

DISCLOSURE OF INVENTION

Problems to be Solved by the Invention

By applying the horizontal magnetic field, it is possible to suppress instability of the convection of the silicon melt in the crucible, thereby obtaining stable melt convection. However, to grow a crystal having a large diameter, it is necessary to use a crucible having a large diameter and increase the amount of the melt. In this case, it was made clear that a sufficient effect could not be obtained only by applying the horizontal magnetic field and a region of unstable melt convection existed. In addition, when using Helmholtz type magnets and placing the chamber of the apparatus for pulling a silicon single crystal between two magnets in parallel arrangement, even though a uniform distribution of the horizontal magnetic field can be obtained by controlling the design of the diameter of the coils, large-sized magnets are required in order to obtain magnetic field of necessary strength, thereby requiring a large space for the apparatus.

Recently, space-saving type magnets for horizontal magnetic fields have been developed, in which each magnet coil is deformed and integrated in a ring-like case surrounding the chamber of the apparatus for pulling a silicon single crystal. In the case of such space-saving type horizontal-field magnets, the generated magnetic field may show a heterogeneous distribution in strength because of the restricted space for the coil-design. As a result of comparing measured distribution of magnetic field strength and experimentally grown crystals, it was made clear that an unstable region was generated in the silicon melt in relation with the distribution of the magnetic field and the setting position of the magnetic field.

When the unstable region is generated in the silicon melt during pulling a crystal, impurities (including oxygen or the like) exhibit heterogeneous distribution in the silicon single crystal and the impurities also show heterogeneous distribution along the direction of crystal growth.

In the case of growing a large-diameter silicon single crystal, the crystal growth is often performed such that the shape of the solid-liquid interface is controlled to have an upwardly convex shape so as to increase the growth rate of the crystal, thereby enhancing the productivity. In that case, if an unstable region is generated in the silicon melt, concentrations of impurities show heterogeneous distribution in a sectional plane vertical to the pulling axis of the crystal (that is, in a plane parallel to a wafer surface obtained from the single crystal). For example, the distribution of the concentration is observed such that the concentration is varied in the plane. Here the concentrations of impurities denote the oxygen concentration and the dopant concentration, which define carrier concentration in the silicon single crystal. If an unstable region is generated in the silicon melt during growing a crystal while controlling the shape of the solid-liquid interface to have an upwardly convex shape, in a plane of a wafer sliced from the silicon single crystal, concentration of impurities show a distribution such that the concentration is varied concentrically in the plane. In the device production process, fluctuations of the oxygen concentration and the dopant concentration to high concentration or to low concentration in a minute range causes insufficient gettering of heavy metal impurities by differences in the density of crystal defects. In addition, there is a possibility of deteriorating wafer properties such as resistivity or the like that are important as device properties. As a result, the yield of satisfactory wafers obtained from the single crystal and the yield of a device obtained from a wafer are reduced.

Based on the above-described circumstances, an object of the present invention is to provide an apparatus for pulling a silicon single crystal and a method of pulling a silicon single crystal that enable growth of silicon single crystals that provide wafers in which non-uniformity in gettering ability and in-plane heterogeneity of resistivity or the like can be suppressed. Using such wafers, it is possible to retain satisfactory properties and yields of the device in the device production process.

Therefore, an object of the present invention is to provide an apparatus for pulling a silicon single crystal and a method of pulling a silicon single crystal that enable growth of silicon single crystals while preventing fluctuation of the oxygen concentration and the dopant concentration in a minute range by suppressing heterogeneous distribution of impurities in the silicon single crystals, thereby homogenizing the concentration of impurities.

Expedients for Solving the Problems

A first aspect of the present invention is an apparatus for pulling a silicon single crystal, comprising: a crucible that stores a silicon melt; a heater that heats the crucible; a crucible driving unit for rotating and/or lifting up and down the crucible; a chamber that holds the crucible and the heater; and a magnetic field applying unit that is provided outside the chamber and applies a magnetic field to the chamber, wherein the magnetic field applying unit is formed along the outer peripheral surface of the chamber and is constituted such that substantially concentric circle-shaped (concentric loop-shaped) equi-strength lines of the magnetic field are formed about the center of the crucible.

In the above-described apparatus for pulling a silicon single crystal, by the horizontal magnetic field applied by the magnetic field applying unit, equi-strength lines of the magnetic field in the silicon melt are formed to have substantially concentric circled-shapes. By the formation of the magnetic field having concentric equi-strength lines, it is possible to suppress instability in convection of the silicon melt in the crucible, thereby obtaining stable convection conditions.

A magnetic field forming substantially concentric equi-strength lines in a partial region is acceptable, if a region of the silicon melt in the crucible is enclosed in a region of the concentric equi-strength lines. The other region in the chamber may be outside the region of the concentric equi-strength lines. Therefore, a space-saving type magnetic field applying unit may be used. In addition, in the vertical direction, the magnetic field is acceptable if the region of the substantially concentric equi-strength lines at least encloses the vertical position of the silicon melt.

It is acceptable if substantially straight magnetic flux lines are formed by the application of the magnetic field in the region of the silicon melt in the crucible. In the other part, the magnetic flux lines may more or less curved from the straight lines.

An apparatus for pulling a silicon single crystal according to the second aspect of the present invention comprises: a crucible that stores a silicon melt; a heater that heats the crucible; a crucible driving unit for rotating and/or lifting up and down the crucible; a chamber that holds the crucible and the heater; and a magnetic field applying unit that is provided outside the chamber and applies a magnetic field to the chamber, wherein the magnetic field applying unit is formed along the outer peripheral surface of the chamber and is constituted such that the strength of the magnetic field monotonously decrease or monotonously increases from the melt surface of the silicon melt to the bottom face of the crucible.

In this apparatus for pulling a silicon single crystal, the oxygen concentration in the silicon single crystal ingot being pulled decreases by a predetermined proportion throughout the whole length along the growth direction (axial direction) of the silicon single crystal ingot, and the crystal does not include a portion in which the oxygen concentration fluctuates unstably.

Where the strength of the magnetic field monotonously decrease or monotonously increases from the melt surface of the silicon melt to the bottom face of the crucible, it is preferable that the variation range of the strength of the magnetic field is controlled to be within the range of 0.6 to 0.9 times the maximum strength of the magnetic field applied to the chamber by the magnetic field applying unit. By this setting, it is possible to suppress the heterogeneous distribution of impurity concentration and prevent fluctuations of the oxygen concentration and the dopant concentration within the minute range.

The above-described magnetic field applying unit may be constituted to have a substantially ring-like shape so as to surround the chamber. Specifically, two, or three, or four ring-shaped magnet coils may be attached to a cylindrical wall concentric with the side-wall of the crucible, such that the magnet coils are placed in an axisymmetric arrangement at the same height. In other words, the shape of the each coil may trace a nodal line between a first cylindrical surface having a vertical axis and a second cylindrical surface having a horizontal axis, where the second cylindrical surface has a diameter smaller than that of the first cylindrical surface, and the horizontal axis of the first cylinder intersects the vertical axis of the second cylinder. Alternatively, the magnetic field applying unit may have a constitution such that a coil of one side in the axisymmetric arrangement may be replaced by a plurality of coils. The shapes of the coils may be slightly modified, for example, based on the consideration of space-saving. By such constitutions, it is possible to decrease the size and weight of an apparatus for pulling a silicon single crystal equipped with a horizontal magnetic field applying unit.

In the apparatus for pulling a silicon single crystal according to the first aspect, the magnetic field applying unit may be constituted such that substantially concentric circle-shaped equi-strength lines of the magnetic field are formed about the center of the crucible, and the strength of the magnetic field monotonously decrease or monotonously increases from the melt surface of the silicon melt to the bottom face of the crucible.

By the use of the apparatus for pulling a silicon single crystal according to the present invention, in a method of pulling a single crystal (a method of growing a silicon single crystal) by dipping a seed crystal in a silicon melt stored in a crucible and pulling the seed crystal while rotating the seed crystal, the method may apply a horizontal magnetic field such that at the position corresponding to the melt, substantially concentric circle-shaped equi-strength lines of the magnetic field are formed about the center of the crucible, while maintaining the surface of the melt at a predetermined position by lifting up the crucible in accordance with the decrease of the melt with the pulling of the single crystal.

By the use of the apparatus for pulling a silicon single crystal according to the present invention, in a method of pulling a single crystal (a method of growing a silicon single crystal) by dipping a seed crystal in a silicon melt stored in a crucible and pulling the seed crystal while rotating the seed crystal, the method may apply a horizontal magnetic field such that the strength of the magnetic field monotonously decrease or monotonously increases from the melt surface of the silicon melt to the bottom face of the crucible, while maintaining the surface of the melt at a predetermined position by lifting up the crucible in accordance with the decrease of the melt with the pulling of the single crystal.

In the above-described method, the horizontal magnetic field may be applied such that at the position corresponding to the melt, substantially concentric circle-shaped equi-strength lines of the magnetic field are formed about the center of the crucible, and the strength of the magnetic field monotonously decrease or monotonously increases from the melt surface of the silicon melt to the bottom face of the crucible.

In the above-described method, the horizontal magnetic field may be applied such that at the position corresponding to the melt, substantially concentric circle-shaped equi-strength lines of the magnetic field are formed about the center of the crucible, and the strength of the magnetic field monotonously decrease or monotonously increases from the melt surface of the silicon melt to the bottom face of the crucible.

In the above-described method using the apparatus for pulling a silicon single crystal according to the present invention, the variation range of the strength of the magnetic field may be controlled to be within the range of 0.6 to 0.9 times the maximum strength of the magnetic field applied to the chamber by the magnetic field applying unit.

Effects Of The Invention

According to the apparatus for pulling a silicon single crystal and the method for pulling a silicon single crystal according to the present invention, by monotonously and gradually increasing or by monotonously and gradually decreasing the strength of the magnetic field in the whole portion from the melt surface of the silicon melt to the bottom face of the crucible, it is possible to pull a silicon single crystal in which the oxygen concentration decreases by a predetermined proportion throughout the whole length along the growth direction (axial direction) of the silicon single crystal ingot, and the crystal does not include a portion in which the oxygen concentration fluctuates unstably. Where an unstable portion is generated, in-plane distribution of the oxygen concentration in a section of the silicon single crystal ingot exhibits a large range of fluctuation within a minute range. Therefore, if a silicon wafer obtained from the unstable region is used in the production of a device, due to variation in the defect density, insufficient capability of gettering of heavy metal impurities appears in the device production process. By the present invention, it is possible to suppress the heterogeneous distribution of impurity concentration, and prevent the fluctuations of the oxygen concentration and the dopant concentration within the minute range, inhibit the fluctuation of resistivity due to the fluctuated concentration of the dopant concentration and maintain the properties and the yield of the device at satisfactory levels in the device production process.

BEST MODE FOR CARRYING OUT THE INVENTION

Figure 1:
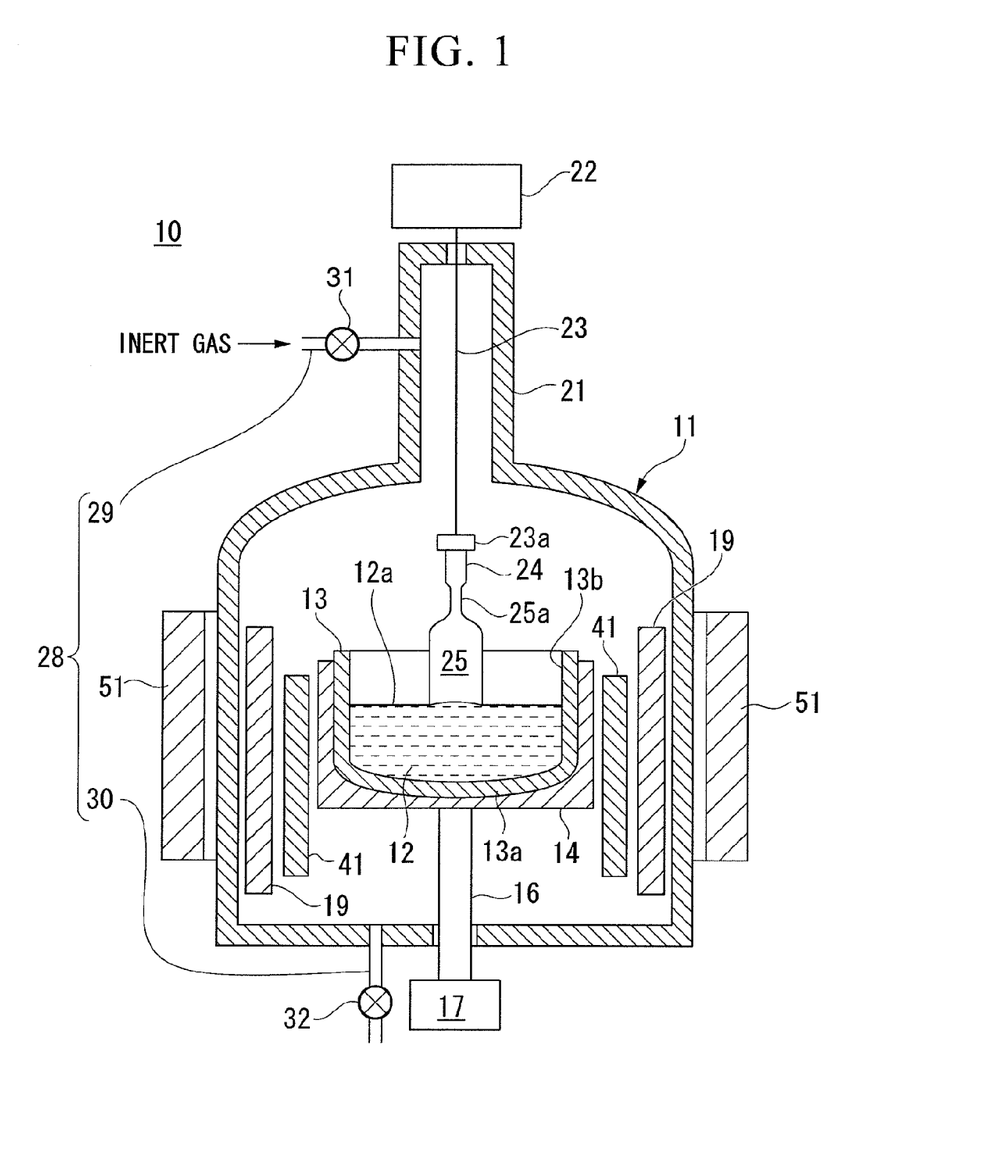
FIG. 1 is a side sectional view schematically showing a single crystal pulling apparatus according to the present invention.
Figure 2:
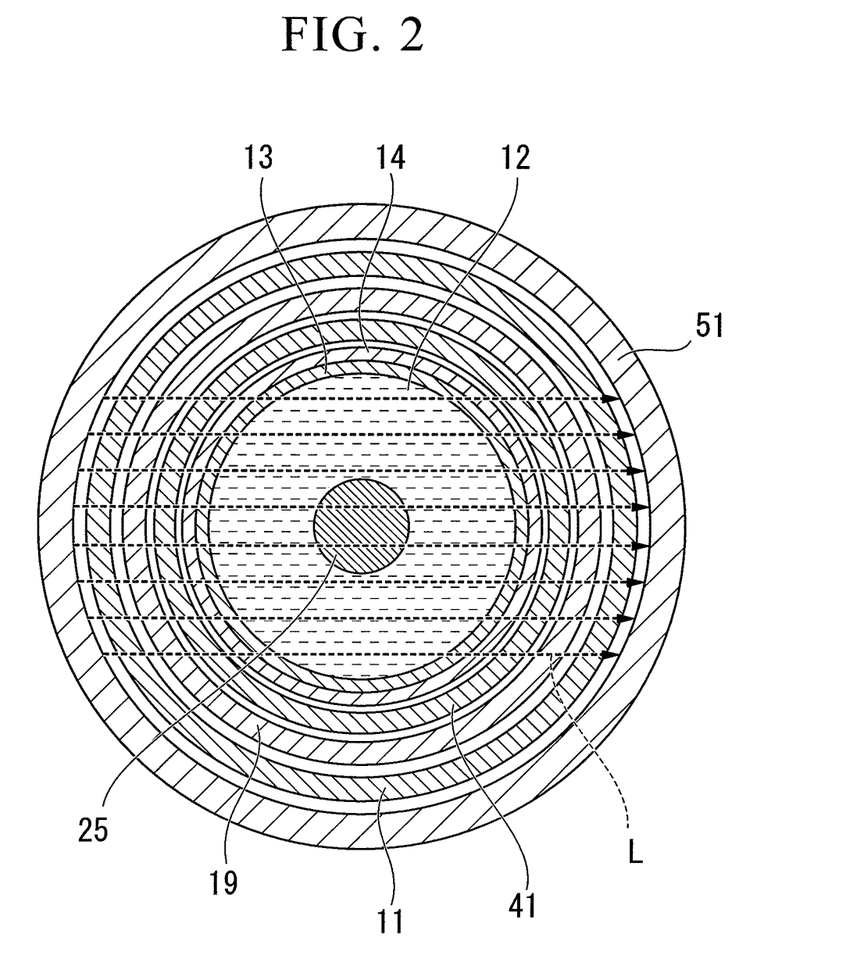
FIG. 2 is a top sectional view schematically showing the single crystal pulling apparatus of FIG. 1.

In the following, an embodiment is explained, in which a single-crystal pulling apparatus according to the present invention is employed as an apparatus for pulling a silicon single crystal. FIG. 1 is a side sectional drawing showing a apparatus for pulling a silicon single crystal according to the present invention. FIG. 2 is a showing a top sectional drawing of the silicon single crystal pulling apparatus, viewed from above the apparatus. A silicon single crystal pulling apparatus 10 is provided with a chamber 11, a quartz crucible 13 which is installed in the chamber and stores a silicon melt 12, a side heater 41 for heating the silicon melt 12, a heat-insulating member 19, and a crucible driving unit 17, and a magnetic field applying unit 51 which is provided to the outside of the chamber and applies a horizontal magnetic field to the chamber 11.

The chamber 11 comprises a cylindrical shaped lower part having a bottom, a ceiling part which is tapered from the lower part towards the upward direction, and a casing 21 vertically standing from the center of the ceiling part. The casing 21 has a diameter smaller than that of the lower part of the chamber 11.

The quartz crucible 13 is placed in the interior of the lower part of the chamber 11 and has a substantially cylindrical body portion 13b which opens to the upward direction and a bottom portion 13a which closes the downward direction of the body portion 13b. The outer periphery of the quartz crucible 13 is supported by a graphite susceptor (crucible supporting unit) 14. Via the graphite susceptor 14, the lower face of the quartz crucible 13 is fixed to the upper end of a support shaft 16. The lower portion of the support shaft 16 is connected to a crucible driving unit 17. The side heater 41 is provided so as to surround the outer periphery of the body portion 13b of the quartz crucible 13 via the graphite susceptor 14.

The side heater 41 is constituted to have, for example, a cylindrical shape so as to surround the quartz crucible 13, and heat the quartz crucible 13. To the interstitial space between the side heater 41 and the chamber 11, a cylindrical heat-insulating member 19 is provided so as to surround the side heater 41.

Figure 3A:
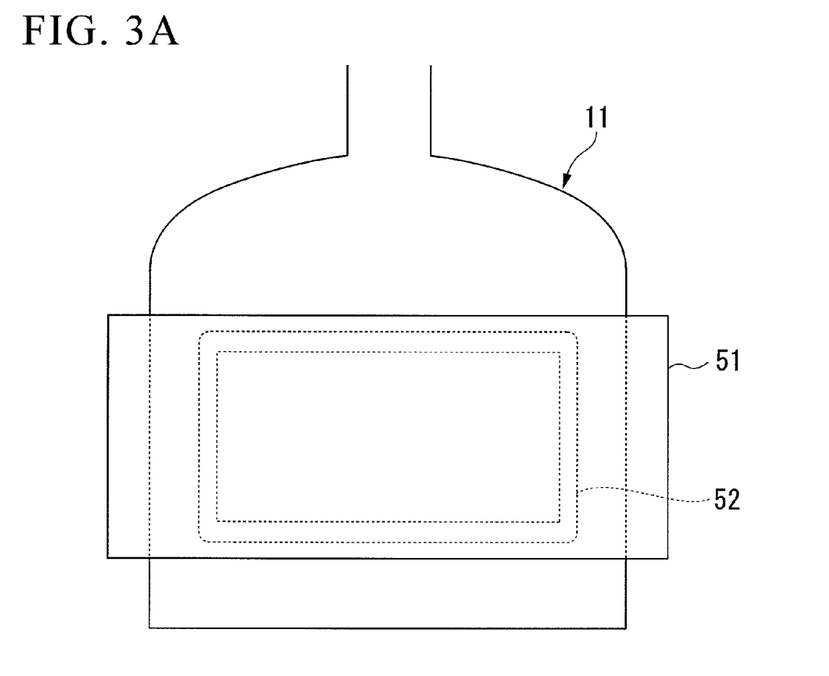
FIG. 3A is a drawing showing an example of a coil arrangement in the magnetic field applying unit of FIG. 1.
Figure 3B:
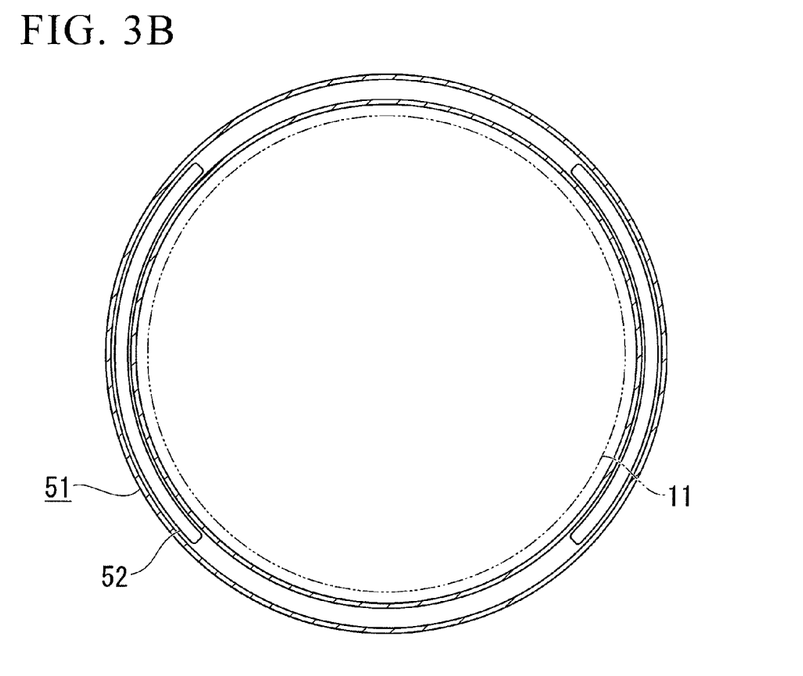
FIG. 3B is a top sectional view showing an example of a coil arrangement in the magnetic field applying unit.

The magnetic field applying unit 51 is a space-saving type horizontal-field magnet having a ring-shaped case and at least two magnetic coils installed in the case in an opposite arrangement. The magnetic field applying unit 51 is placed so as to surround the lower part of the chamber 11 of the silicon single crystal pulling apparatus 10. An example of the coil arrangement in the magnetic field applying unit 51 is shown in FIG. 3A and FIG. 3B. FIG. 3B is a top sectional drawing, showing a relation between the coil arrangement and the chamber in the magnetic field applying unit 51. FIG. 3A is a side view from the side of one coil. For example, as shown in FIG. 3A and FIG. 3B, the magnetic field applying unit 51 may be constituted such that a pair of coils 52 is installed in an axisymmetric arrangement in a ring-shaped case made of a non-magnetic material. Each of the coils is deformed in accordance with the semicircle arc and is installed in the case. Each of coils is deformed to have an elongated shape such as an oblong shape, a rectangle shape, and an elliptic shape, further deformed such that the longitudinal axis is curved in accordance with the arc of the case, and is installed in the case so as to form an opposite arrangement. Such a magnetic field applying unit 51 applies a horizontal magnetic field L, via the chamber 11, to the silicon melt 12 stored in the crucible 13. Details of the magnetic field application are explained below.

The crucible driving unit 17 comprises a first driving motor (not illustrated) for rotating the crucible, and a lifting motor (not illustrated) for lifting the crucible 13 up and down, and is constituted such that, by these motors, the crucible 13 is rotated in a predetermined direction and is movable up and down. The crucible driving unit 17 is constituted to control the elevation of the crucible 13 to be corresponding to the decreasing amount of silicon melt 12 so as to maintain the melt surface 12a of the silicon melt 12, which lowers in accordance with the pulling of a seed crystal 24, at the above-described predetermined level.

The cylindrical casing 21 having a smaller diameter than that of the chamber 11 is provided above the chamber 11. A pulling head 22 is provided on the top end of the casing 21. The pulling head 22 is turnable at a horizontal state. A wire cable 23 is suspended from the head 22 towards the rotation center of the crucible 13.

Although they are not illustrated, a second rotation motor for rotating the head 22 and a pulling motor for winding and unwinding the wire cable 23 are installed in the inside of the head 22. The seed crystal 24 to be dipped in the silicon melt 12 and pulled up to grow the silicon single crystal ingot 25 is attached to the lower end of the wire cable 23 via a holder 23a.

The chamber 11 is connected with a gas supply/exhaustion unit 28 for supplying an inert gas such as argon gas to the chamber 11 from its upper part, and exhausting the inert gas from the lower part of the chamber 11.

The gas supply/exhaustion unit 28 has a supply pipe 29 which is connected to the circumferential wall of the casing 21 in one end, and to an inert gas tank (not shown) in the other end, and an exhausting pipe 30 which is connected to the bottom wall of the chamber 11 in one end, and to a vacuum pump 30 in the other end (not shown). First and a second flow control valves 31 and 32 are respectively provided to the supply pipe 29 and to the exhausting pipe 30 so as to control the flow rate of the inert gas in the pipes 29 and 30.

Next, a sequence for pulling a silicon single crystal using the single crystal pulling apparatus of the above-described constitution, and the effect of the invention are explained. In the production of a silicon single crystal using the single crystal pulling apparatus of the present embodiment, firstly, a nugget of polycrystalline silicon raw material is charged in the crucible 13, and is melted by the side heater 41 to form the silicon melt 12. Then, via the holder 23a, the seed crystal 24 is suspended by the wire cable 23 directly above the melt surface 12a of the silicon melt 12.

Next, by opening the first and the second flow controlling valves 31 and 32, an inert gas is supplied through the supply pipe 29 into the casing 21. Along with the SiOx gas evaporated from the surface of the silicon melt, the inert gas is exhausted from the exhaustion pipe 30. In this state, the seed crystal 24 is lowered such that the end of the seed crystal 24 is made to contact the melt 12 by unwinding the wire 23 using the pulling motor (not shown) of the pulling head 22.

Since a slip dislocation is introduced to the end portion of the seed crystal 24 by a thermal stress when the end portion of the seed crystal 24 is made to contact the silicon melt 12, a seed drawing portion 25a having a diameter of approximately 3 mm is subsequently formed by gradually pulling up the seed crystal 24. By the formation of the seed drawing portion 25a, the dislocation introduced in the seed crystal is eliminated. After that, by further pulling the seed crystal 24, a dislocation-free silicon single crystal ingot 25 is grown beneath the seed drawing portion 25a.

During the growth of the silicon single crystal ingot 25, the silicon melt 12 is heated by the side heater 41, and is applied with a magnetic field by the magnetic field applying unit 51. In this state, the lifting motor lifts up the crucible 13 in accordance with the decreasing amount of the silicon melt 12 accompanied by the pulling of the seed crystal 24, and maintains the surface 12a of the silicon melt 12 at a predetermined level.

In the single crystal pulling apparatus of the present embodiment, by the magnetic field applying unit 51 which is provided in a ring shape outside of the chamber 11, a horizontal magnetic field is generated and applied to the silicon melt 12. The magnetic field applying unit 51 is a horizontal field magnet where magnet coils are installed in a ring-shaped case which surrounds the chamber 11. The magnetic field applied to the silicon melt 12 by the magnetic field applying unit 51 having such configuration forms equi-strength lines having a loop-like shape.

Figure 4:
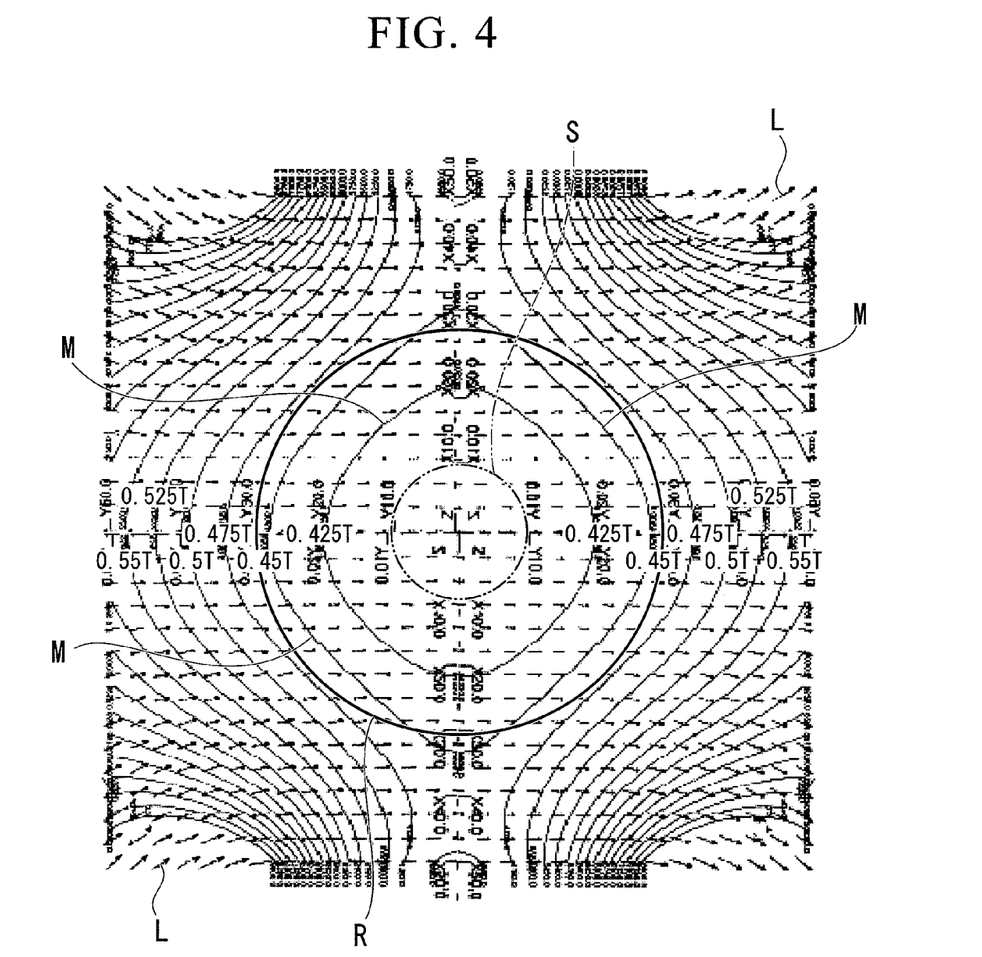
FIG. 4 is an explanatory drawing showing lines of magnetic flux and equi-strength lines of a magnetic field applied to the silicon melt in the crucible.

The distribution of the magnetic field formed inside the crucible 13 by the magnetic field applying unit 51 is shown in FIG. 4 using equi-strength lines or the like. The magnetic field applying unit 51 is a horizontal field magnet where magnetic coils are installed in the ring-shaped case. In the drawing, the solid line R denotes the crucible, and fine arrows denote directions of magnetic flux lines at each position. A pulled-up single crystal ingot S is shown in the vicinity of the center of the crucible 13.

Equi-strength lines M of the magnetic field are shown so as to surround the crucible 13. As shown in FIG. 4, by the horizontal-magnetic field applied by the magnetic field applying unit 51, substantially concentric circle-shaped (concentric loop-shaped) equi-strength lines are formed in the crucible 13.

Figure 5:
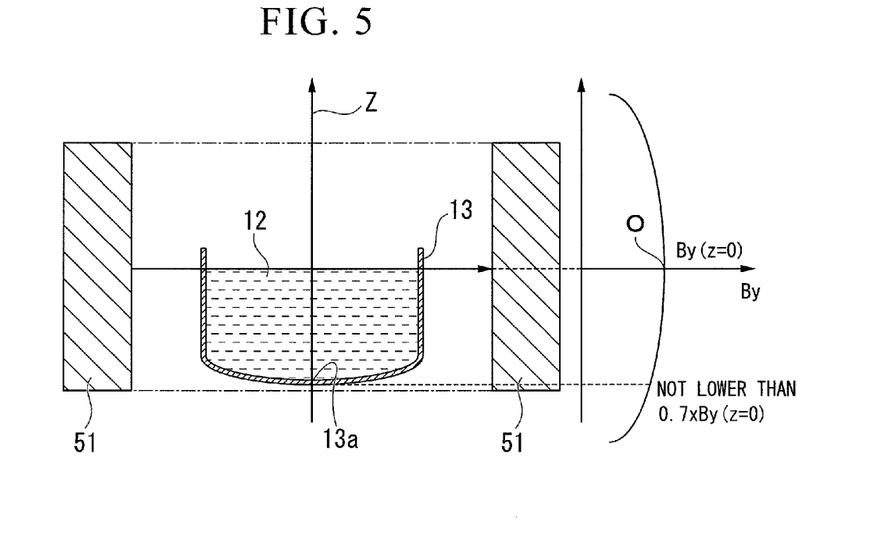
FIG. 5 is an explanatory drawing showing an embodiment of the present invention.

The magnetic field applying unit 51 applies the magnetic field such that the strength of the magnetic field monotonously decrease or monotonously increases from the melt surface of the silicon melt 12 stored in the crucible 13 to the bottom face of the crucible 13. FIG. 5 is a drawing for explaining a relation between the strength of the magnetic field and the silicon melt 12 stored in the crucible 13. In FIG. 5, where O denotes the position along the pulling direction Z in which magnetic field strength By has the highest value, the magnetic field applying 51 generates the magnetic field such that the magnetic field strength By gradually decreases from the center O towards the upward direction, and towards the downward direction. The melt surface 12a of the silicon melt 12 in the crucible 13 is controlled to have the same level as the center O at which the magnetic field strength By has the highest value.

By the above-described setting of the distribution of the magnetic field and the level of the melt surface 12a of the silicon melt 12, the horizontal magnetic field is applied to the silicon melt 12 such that the magnetic field strength By gradually decreases from the melt surface 12a of the silicon melt 12 towards the bottom face 13a of the crucible 13.

Where the magnetic field strength By applied at the position of the melt surface 12a of the silicon melt 12 is denoted as 1, the decrease of the magnetic field strength may be controlled such that the magnetic field strength By at the bottom face 13a of the crucible 13 has a value of 0.6 to 0.9 (that is 0.6 to 0.9 times the highest strength).

As explained above, by using the horizontal field magnet having magnetic coils installed in the ring-shaped case as the magnetic field applying unit 51, and by applying the horizontal magnetic field from the magnetic field applying unit 51 such that the strength of the magnetic field gradually decreases from the melt surface 12a on the silicon melt 12 towards the bottom face 13a of the crucible 13, concentric equi-strength lines of the magnetic field are formed in the silicon melt 12 as shown in FIG. 4, and generation of an unstable region of the silicon melt 12 related to the distribution of the magnetic field strength and the setting position of the magnetic field is inhibited. By avoiding the generation of the unstable region of the silicon melt 12, it is possible to inhibit the generation of heterogeneous distribution of unstably fluctuating impurity concentration in the silicon single crystal, thereby realizing homogeneous or monotonous distribution of impurity concentration along the growth direction of the silicon single crystal.

In addition, by the use of the horizontal field magnet having magnetic coils installed in the ring-shaped case as the magnetic field applying unit 51, compared to the conventional case of using a Helmholtz type magnet, it is possible to realize remarkable downsizing and weight-reducing of the silicon single crystal pulling apparatus having the magnetic field applying unit.

Figure 6:
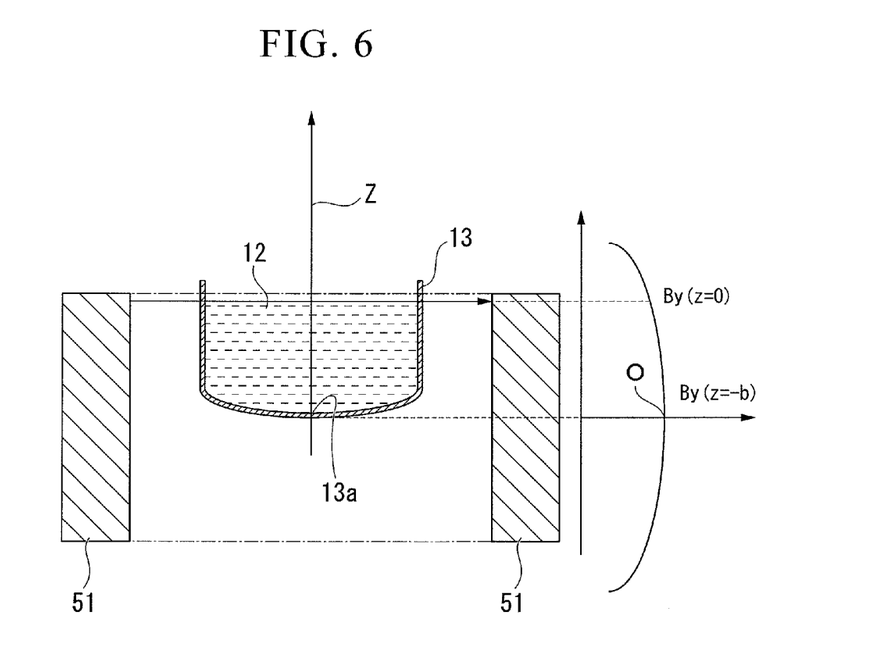
FIG. 6 is an explanatory drawing showing another embodiment of the present invention.

As an alternative to the setting of the magnetic field, as shown in FIG. 5G, in which the strength of the magnetic field monotonously decreases from the melt surface in the crucible 13 towards the bottom face of the crucible 13, it is possible to apply the magnetic field such that strength of the magnetic field monotonously increases from the surface of the melt in the crucible towards the bottom face of the crucible. In FIG. 6, the magnetic field applying unit 51 controls the magnetic field By to have the highest strength along the pulling direction Z at the bottom face 13a of the crucible 13, and the magnetic field is applied such that the strength By of the magnetic field decreases gradually towards the upward direction and towards the downward direction.

By the above-described setting of the distribution of magnetic field strength and the position of the melt surface 12a of the silicon melt 12, the horizontal magnetic field is applied from the magnetic field applying unit 51 such that the strength By of the magnetic field gradually decreases from the bottom face 13a of the crucible 13 towards the melt surface 12a of the silicon melt 12. Where the magnetic field strength By applied at the bottom face 13a of the crucible 13 is denoted as 1, the decrease of the magnetic field strength may be controlled such that the magnetic field strength By at the melt surface 12a of the silicon melt 12 has a value of 0.6 to 0.9 (that is 0.6 to 0.9 times the highest strength). By the above-described setting of the distribution of the magnetic field in relation with the silicon melt 12, it is possible to inhibit the generation of heterogeneous distribution of unstably fluctuating impurity concentration in the silicon single crystal, thereby realizing homogeneous or monotonous distribution of impurity concentration along the growth direction of the silicon single crystal.

EXAMPLES

The inventors examined the action and effect of the invention. In the examination process, firstly, a quartz crucible having a diameter of 24 inches was prepared. Polycrystalline silicon of 160 kg was charged in the crucible as a raw material. Then, the quartz crucible charged with the raw material was heated by a heater thereby forming a silicon melt. A silicon single crystal ingot having a diameter of 200 mm was pulled from the melt. In the pulling process, a horizontal magnetic field was applied to the silicon melt in the quartz crucible using a space-saving type horizontal field magnet (magnetic field applying unit). In the horizontal field magnet, magnetic coils were deformed and installed in a ring-shaped case which was arranged to surround the chamber of the silicon single crystal pulling apparatus.

The application of the horizontal magnetic field to the silicon melt was performed in accordance with three examples according to the present invention.

Figure 7:
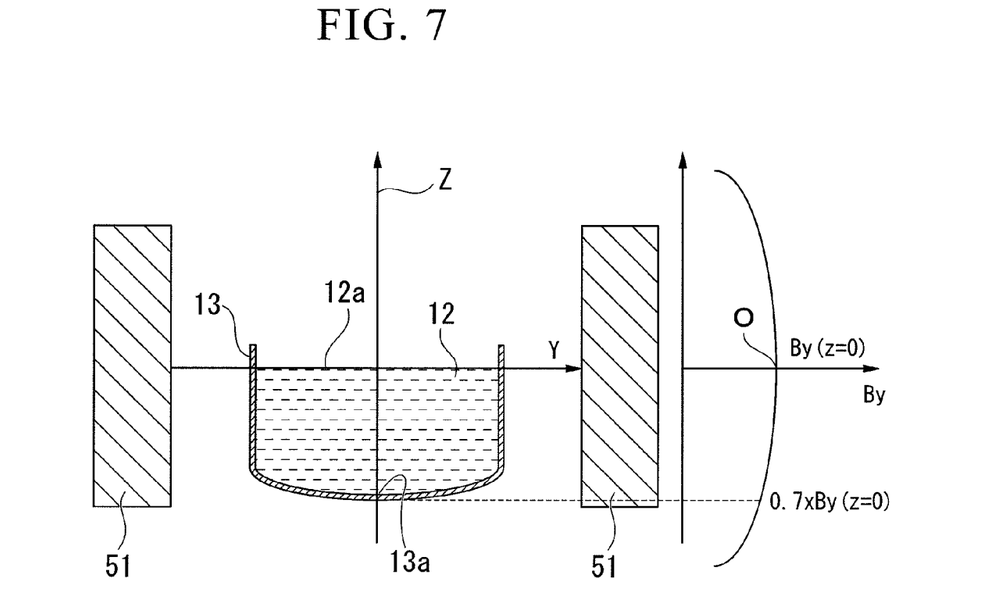
FIG. 7 is an explanatory drawing showing an example of the present invention.
Figure 8:
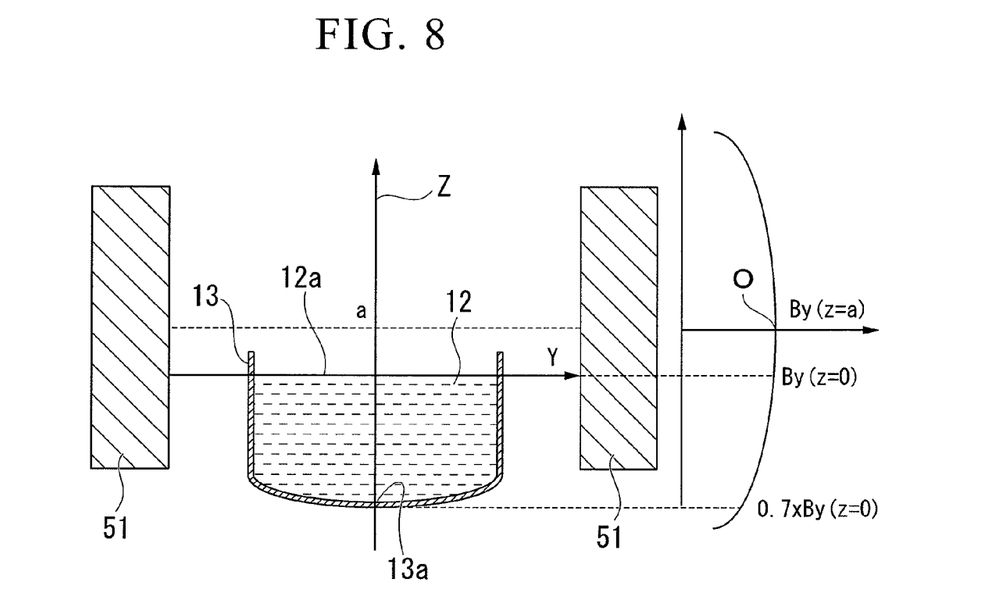
FIG. 8 is an explanatory drawing showing an example of the present invention.

In the first example, as shown in FIG. 7, the magnetic field applying unit 51 generated a magnetic field such that the strength of the magnetic field gradually decreases from the centre O towards the upward and downward direction, where the center O denotes the position along the direction of the pulling axis having the highest strength of the magnetic field. The melt surface 12a of the silicon melt 12 in the crucible 13 was controlled to have the same level as the center O having the highest strength By of the magnetic field, thereby controlling the magnetic field such that the strength By of the magnetic field gradually decreases from the melt surface 12a towards the bottom face 13a of the crucible 13. In this state, a silicon single crystal ingot (Sample 1) was pulled up from the melt. Here the strength By of the magnetic field denotes the Y-component (component which is normal to the pulling axis, and parallel to the flux lines of the magnetic field) of the strength of the magnetic field on a position on the axis of the crucible.

In the second example according to the present invention, as shown in FIG. 7, the magnetic field was generated such that the strength of the magnetic field gradually decreased from the centre O towards the upward and downward direction, where O denoted the position along the direction Z of the pulling axis, having the highest strength of the magnetic field. The melt surface 12a of the silicon melt 12 in the crucible 13 was controlled to have a lower level than that of the center O having the highest strength By of the magnetic field, where a was the vertical distance of the melt surface from the center O. In this state, while applying a horizontal magnetic field such that the strength By of the magnetic field gradually decreases from the melt surface 12a towards the bottom face 13a of the crucible 13, a silicon single crystal ingot (Sample 2) was pulled up from the melt.

Figure 9:
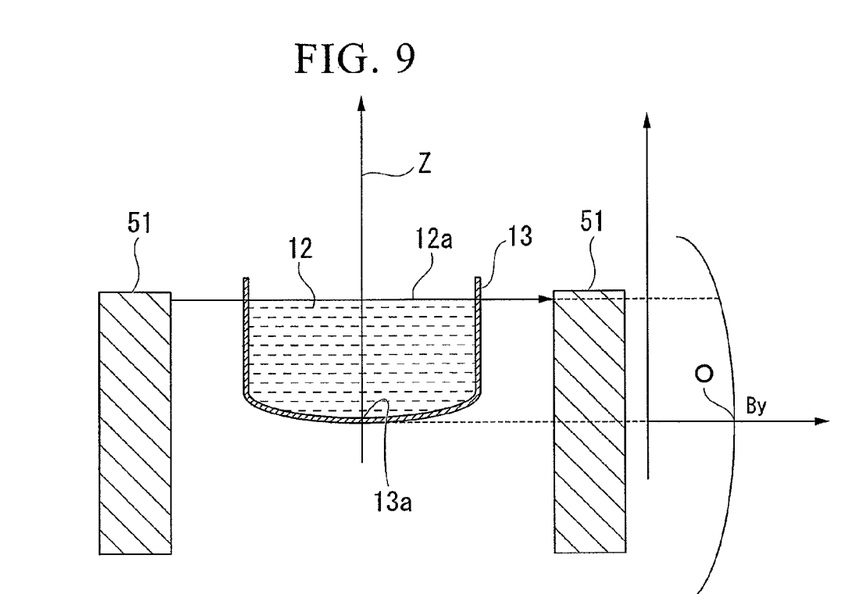
FIG. 9 is an explanatory drawing showing an example of the present invention.

In the third example according to the present invention, as shown in FIG. 9, the magnetic field was generated such that the strength By of the magnetic field gradually decreased from the bottom face 13a of the crucible 13 towards the upward and downward direction, where the magnetic field applying unit 51 controlled the magnetic field to have the highest strength By at the bottom face 13a of the crucible 13 along the direction Z of the pulling axis. In this state, while applying a horizontal magnetic field to the silicon melt 12 such that the magnetic field gradually decreases from the bottom face 13a of the crucible 13 towards the melt surface 12a of the silicon melt, a silicon single crystal (sample 3) was pulled up from the melt.

Figure 10:
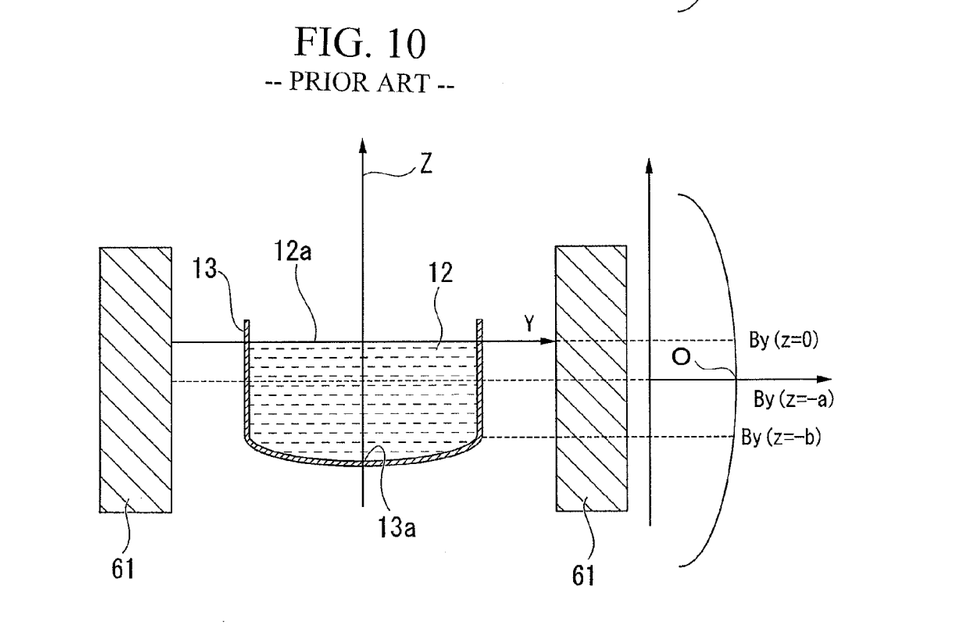
FIG. 10 is an explanatory drawing showing a comparative example according to the prior art.

In the Comparative Example (Prior Art Example) to be compared to the present invention, as shown in FIG. 10, the magnetic field was generated by the magnetic field applying unit 61 such that the strength of the magnetic field gradually decreased from the centre O towards the upward and downward direction, where the center O denoted the position along the direction Z of the pulling axis, having the highest strength By of the magnetic field. The center O showing the highest strength By of the magnetic field was controlled to be a level corresponding to an intermediate position in the silicon melt. In this state, a silicon single crystal ingot (Sample 4) was pulled up from the melt while applying a horizontal magnetic field to the silicon melt such that the strength By of the magnetic field gradually increased from the melt surface 12a (position of z=−a) of the silicon melt 12 towards the level of the intermediate position in the silicon melt 12, and below the intermediate position, the strength By of the magnetic field gradually decreases towards the bottom face 13a of the crucible 13.

For each of the above-explained Examples 1 to 3 (Samples 1 to 3) according to the present invention and Comparative Example (Prior Art Example: Sample 4), a relation between the length XL along the growth direction of the silicon single crystal and the oxygen concentration Oi is shown in FIG. 11A.

Figure 11A:
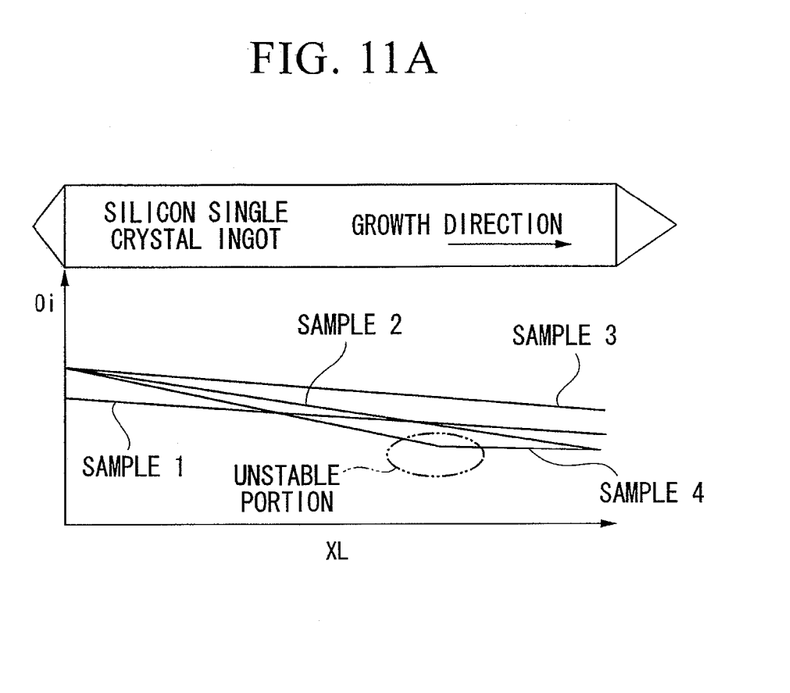
FIG. 11A is a graph showing a result of examination of the present invention and the comparative example.

As shown in FIG. 11A, where the state of the strength By of the magnetic field was maintained throughout the pulling of the whole length of the crystal such that the strength By monotonously increased or monotonously decreased in the whole portion from the surface 12a of the silicon melt 12 to the bottom face 13a of the crucible 13, the oxygen concentration Oi of the thus pulled silicon single crystal ingot decreased with a certain ratio along the whole length of the length XL of the crystal, and an unstable region did not appear. On the other hand, where the horizontal magnetic field was applied to the silicon melt 12 such that the strength By of the magnetic field gradually increased from the melt surface 12a of the silicon melt 12 towards the level of the intermediate position in the silicon melt 12, and below the intermediate position, the strength By of the magnetic field gradually decreases towards the bottom face 13a of the crucible 13, and an unstable portion was generated in the vicinity of the position where the change of the strength By of the magnetic field turns from an increasing trend to a decreasing trend.

In such an unstable portion, because of unstable convection of the silicon melt 12a, as in two examples shown in FIG. 11 by the solid line and the chain line, in-plane distribution of the oxygen concentration Oi showed large fluctuation in the minute range in the section (a section vertical to the growth direction) of the silicon single crystal ingot. Such a large fluctuation of in-plane distribution of the oxygen concentration Oi may cause insufficient gettering of metallic impurities during the device production process, because of differences in density of crystal defects, thereby resulting in deterioration of device properties and device yields and causing an adverse influence. By the present invention, it is possible to inhibit inhomogeneous distribution of impurity concentration and fluctuation of oxygen concentration and impurity concentration in a minute range, thereby maintaining device properties and device yields at a satisfactory level.

Figure 12A:
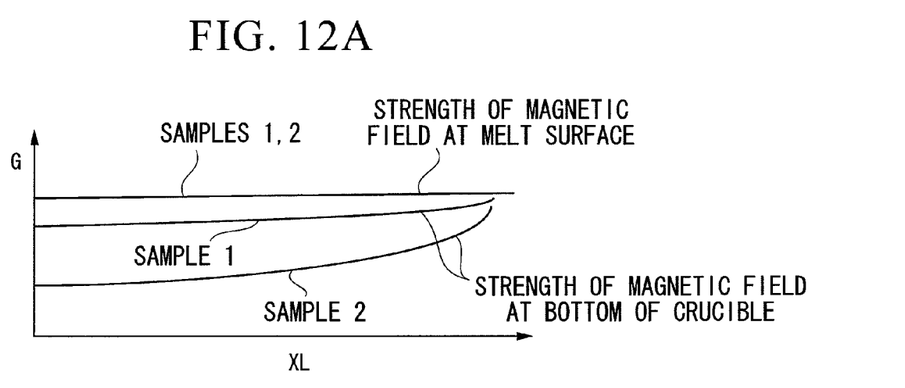
FIG. 12A is a graph showing a result of examination according to the present invention. The graph shows a relation between the pull length of a single crystal and the strength of the magnetic field at the surface of the crucible, and the strength of the magnetic field at the bottom of the crucible.

FIG. 12A is a graph showing a relation between the length XL along the growth direction of the silicon single crystal of each of Samples 1 and 3 of the above-described Examples, strength of the magnetic field at the surface of the silicon melt, and the strength of the magnetic field at the bottom face of the crucible. According to this graph, in each of Samples 1 and 2, the strength of the magnetic field at the surface of the silicon melt is maintained constant throughout the pulling of the whole length of the length XL along the growth direction of the silicon single crystal. The strength of the magnetic field at the bottom face of the crucible gradually increases at a moderate ratio within a strength lower than the strength of the magnetic field at the silicon melt.

Figure 12B:
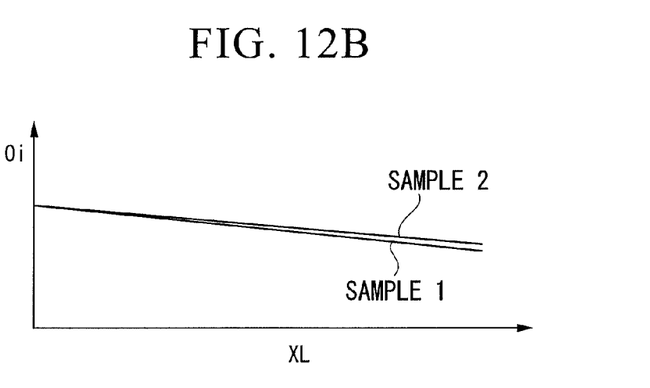
FIG. 12B is a graph showing a result of examination of the present invention. The graph shows a relation between the pull-length and the oxygen concentration of the single crystal.
Figure 12C:
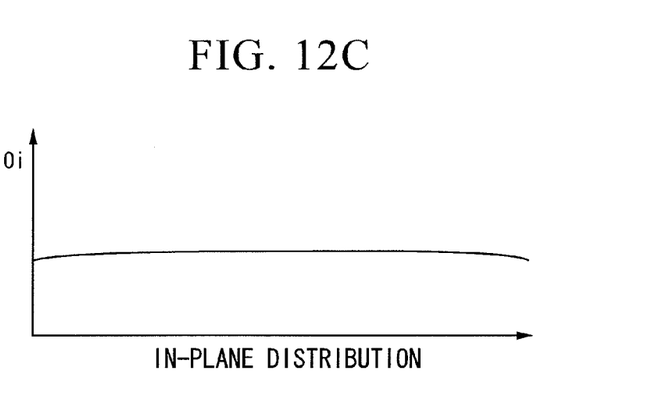
FIG. 12C is a graph showing in-plane distribution of oxygen concentration in a section of the single crystal of the present invention.

By this distribution of the magnetic field, as shown in FIG. 12B, in each of Samples 1 and 2, the oxygen concentration Oi of the silicon single crystal ingot decreases at a certain ration throughout the whole length XL of the crystal. Thus, as shown in FIG. 12 C, in-plane distribution of the oxygen concentration Oi in the silicon single crystal ingot shows a stable distribution without generating fluctuation.

Figure 13A:
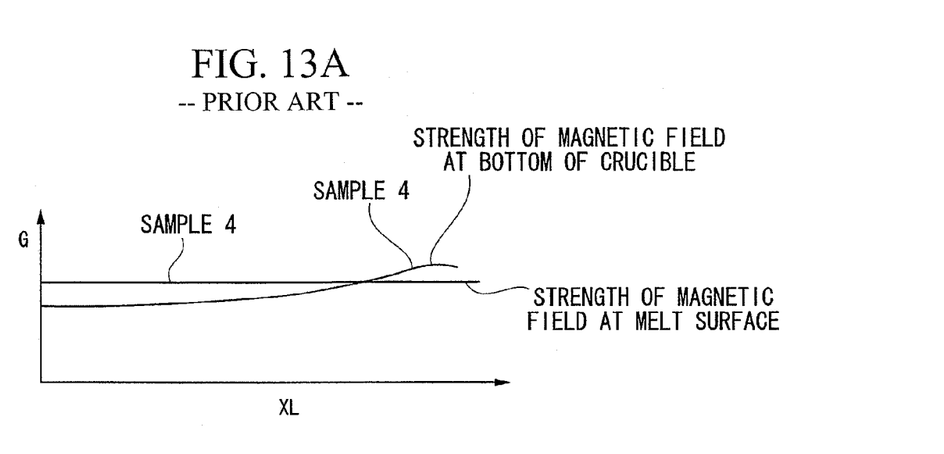
FIG. 13A is a graph showing a result of examination of the comparative example. The graph shows a relation between the pull length of a single crystal and the strength of the magnetic field at the surface of the crucible, and the strength of the magnetic field at the bottom of the crucible.

FIG. 13A is a graph showing a relation between the length XL along the growth direction of the silicon single crystal of the Comparative Example (Prior Art), strength of the magnetic field at the surface of the silicon melt, and the strength of the magnetic field at the bottom face of the crucible. According to this graph, the strength of the magnetic field at the surface of the silicon melt is maintained constant throughout the pulling of the whole length of the length XL along growth direction of the silicon single crystal. Whereas, the strength of the magnetic field at the bottom face of the crucible exceeds the strength of the magnetic field at the surface of the silicon melt when the pull length of the silicon single crystal slightly exceeds half of the length XL along the growth direction of the silicon single crystal ingot, after that, the strength of the magnetic field gradually decreases.

Figure 11B:
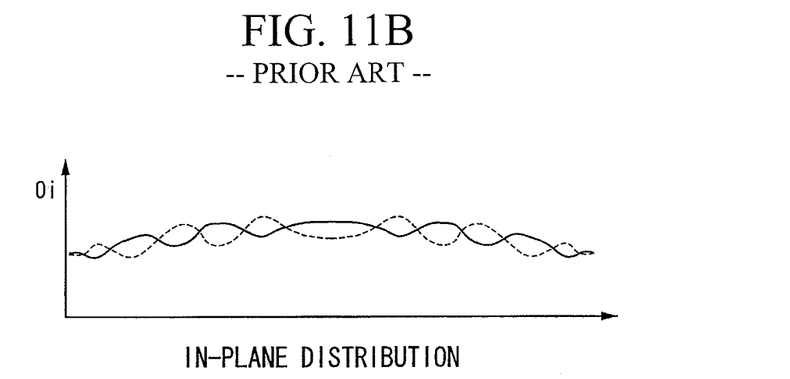
FIG. 11B is a drawing showing in-plane distribution of oxygen concentration in a section obtained from an unstable portion of the single crystal of the comparative example.
Figure 13B:
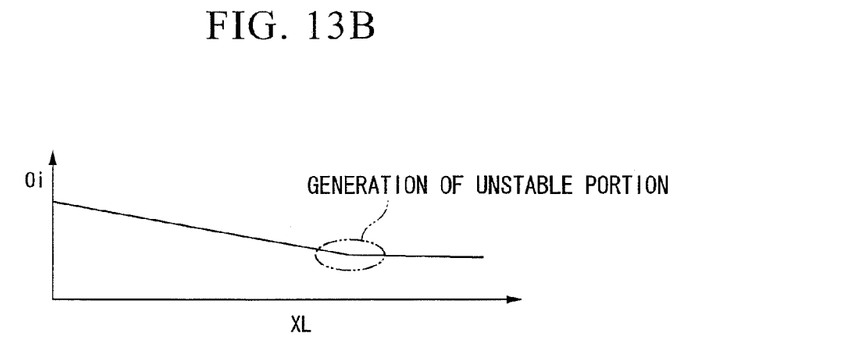
FIG. 13B is a graph showing a result of examination of the present invention. The graph shows a relation between the pull-length and the oxygen concentration of the single crystal.

In such a distribution of the magnetic field, because of the change of melt convection, unstable region is generated as shown in FIG. 13B, resulting in a large fluctuation of in-plane distribution of the oxygen concentration as shown in FIG. 11B. As a result, insufficient gettering of heavy metal impurities is caused by the difference in crystal defect density.

From the results of examination, it was confirmed that fluctuation of impurity concentration could be suppressed by pulling a single crystal according to the present invention while applying a magnetic field such that substantially concentric equi-strength lines of the magnetic field is formed in the silicon melt, and the strength of the magnetic field constantly (monotonously) increases or decreases in the vertical direction, and maintaining the state of the magnetic field throughout the whole length of the pull length of the crystal. Therefore, it was confirmed that according to the present invention, it was possible to inhibit the fluctuation of oxygen concentration and dopant concentration in a minute range, reducing generation of inhomogeneous distribution of oxygen concentration and resistivity within a plane and along the growth direction, thereby maintaining satisfactory device properties and device characteristics.

INDUSTRIAL APPLICABILITY

According to the present invention, it is possible to depress the unstable convection of the silicon melt during the pulling process of the silicon single crystal, thereby inhibiting fluctuation of the oxygen concentration and the dopant concentration in the silicon single crystal within a minute range. By using silicon wafers obtained from such a silicon single crystal in the production of a device, it is possible to inhibit the fluctuation of gettering ability, fluctuation of in-plane distribution of resistivity or the like, thereby maintaining satisfactory device properties and yields in the device production process.

The invention claimed is:

1. An apparatus for pulling a silicon single crystal, comprising:
   a crucible that stores a silicon melt;
   a heater that heats the crucible;
   a crucible driving unit for rotating and/or lifting up and down the crucible;
   a chamber that holds the crucible and the heater; and
   a magnetic field applying unit that is provided outside the chamber and applies a magnetic field to the chamber,
   wherein:
   the magnetic field applying unit is formed along an outer peripheral surface of the chamber to have a substantially ring-like shape surrounding the chamber, and has a ring-shaped case and at least two magnetic coils attached to a cylindrical wall of the case in an opposite arrangement, where each coil of the at least two magnetic coils is deformed to have an elongated shape and is further deformed such that the longitudinal axis has a radius of curvature matching a radius of curvature of the cylindrical wall of the case;

substantially concentric circle-shaped equi-strength lines of a magnetic field are formed about a center axis of the crucible by the magnetic field applying unit in a horizontal direction relative to the center axis;

the magnetic field applying unit is configured to generate the magnetic field such that the strength of the magnetic field in the horizontal direction gradually decreases from a highest value towards the upward direction along the center axis and towards the downward direction along the center axis;

the magnetic field applying unit is configured such that a strength of the magnetic field selectively monotonously decreases or monotonously increases from a melt surface of the silicon melt to a bottom face of the crucible;

a variation range of the strength of the magnetic field selectively monotonously decreasing or monotonously increasing from the melt surface of the silicon melt to the bottom face of the crucible is controlled by a controller having a programmable memory with a program, to be within the range of 0.6 to 0.9 times a maximum strength of the magnetic field applied to the chamber by the magnetic field applying unit; and the at least two magnetic coils installed in the ring-shaped case consist of a pair of coils axisymmetrically arranged in the ring-shaped case.

2. An apparatus for pulling a silicon single crystal comprising:

a crucible that stores a silicon melt;

a heater that heats the crucible;

a crucible driving unit for rotating and/or lifting up and down the crucible;

a chamber that holds the crucible and the heater;

a magnetic field applying unit that is provided outside the chamber and applies a magnetic field to the chamber, wherein the magnetic field applying unit is formed along an outer peripheral surface of the chamber, wherein the magnetic field applying unit is configured to generate the magnetic field such that the strength of the magnetic field in a horizontal direction relative to a center axis of the crucible gradually decreases from a highest value towards the upward direction along the center axis and towards the downward direction along the center axis, wherein substantially concentric circle-shaped equi-strength lines of the magnetic field are formed about the center axis by the magnetic field applying unit in the horizontal direction, and wherein the crucible driving unit is configured lower the crucible such that a strength of the magnetic field applied by the magnetic field applying unit monotonously decreases from a melt surface of the silicon melt to a bottom face of the crucible; and a controller having a programmable memory with a program configured to control a variation range of the strength of the magnetic field in the horizontal direction by selectively monotonously decreasing or monotonously increasing from the melt surface of the silicon melt to the bottom face of the crucible to be within the range of 0.6 to 0.9 times a maximum strength of the magnetic field applied to the chamber by the magnetic field applying unit, wherein the magnetic field applying unit is formed to have a substantially ring-like shape surrounding the chamber.

* * * * *